(12) United States Patent
Huang et al.

(10) Patent No.: US 7,858,446 B2
(45) Date of Patent: Dec. 28, 2010

(54) SENSOR-TYPE SEMICONDUCTOR PACKAGE AND FABRICATION METHOD THEREOF

(75) Inventors: Chien-Ping Huang, Hsinchu Hsien (TW); Tse-Wen Chang, Taichung Hsien (TW); Chang-Yueh Chan, Taichung Hsien (TW); Cheng-Yi Chang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 481 days.

(21) Appl. No.: 11/982,516

(22) Filed: Nov. 2, 2007

(65) Prior Publication Data

US 2008/0105942 A1    May 8, 2008

(30) Foreign Application Priority Data

Nov. 3, 2006    (TW) .............................. 95140685 A (51) Int. Cl.
H01L 21/48    (2006.01)
H01L 21/50    (2006.01)
H01L 21/78    (2006.01)

(52) U.S. Cl. ................... 438/116; 438/110; 438/113; 438/127; 438/460

(58) Field of Classification Search ................ None
See application file for complete search history.

(56) References Cited

U.S. PATENT DOCUMENTS

| | | |
|---|---|---|
| 5,534,725 A | 7/1996 | Hur et al. |
| 5,962,810 A | 10/1999 | Glenn |
| 6,060,340 A | 5/2000 | Chou et al. |
| 6,262,479 B1 | 7/2001 | Chou et al. |
| 6,492,699 B1 * | 12/2002 | Glenn et al. ............... 257/433 |
| 6,512,219 B1 * | 1/2003 | Webster et al. ........... 250/208.1 |
| 6,590,074 B1 | 7/2003 | O'Brien et al. |
| 6,590,269 B1 | 7/2003 | Chuang et al. |
| 6,873,024 B1 * | 3/2005 | Prabhu et al. ............... 257/434 |

* cited by examiner

*Primary Examiner*—Scott B Geyer
(74) *Attorney, Agent, or Firm*—Peter F. Corless; Steven M. Jensen; Edwards Angell Palmer & Dodge LLP (57) ABSTRACT

A sensor-type semiconductor package and a fabrication method thereof are provided. The fabrication method of the sensor-type semiconductor package includes steps of: providing a wafer having sensor chips; attaching light-permeable bodies to the sensor chips, wherein each light-permeable body has a covering layer and an adhesive layer; singulating the wafer so as to obtain a plurality of separated sensor chips with the light-permeable bodies attached thereon; attaching and electrically connecting the separated sensor chips to a substrate module having substrates, forming an encapsulant encapsulating the sensor chips and the light-permeable bodies; cutting the encapsulant along edges of the light-permeable bodies to a depth at least corresponding the bottom edges of the covering layers; removing the covering layers with the encapsulant mounted thereon to expose the light-permeable bodies; and cutting between the substrates to obtain a plurality of sensor-type semiconductor packages.

20 Claims, 9 Drawing Sheets

SENSOR-TYPE SEMICONDUCTOR PACKAGE AND FABRICATION METHOD THEREOF

FIELD OF THE INVENTION

The present invention relates generally to semiconductor packages and fabrication methods thereof, and more particularly to sensor-type semiconductor packages and fabrication methods thereof.

BACKGROUND OF THE INVENTION

Conventionally, to obtain an image sensor package, a sensor chip is mounted to a chip carrier and electrically connected to the chip carrier via the bonding wires, then the top surface of the sensor chip is covered by a glass such that image light can be captured by the sensor chip. Thereafter, such an image sensor-type package is integrated to an external device such as a printed circuit board for further being applied in various kinds of electronic products such as digital cameras, digital videos, optical mouse, mobile phones and so on.

Figure 1:
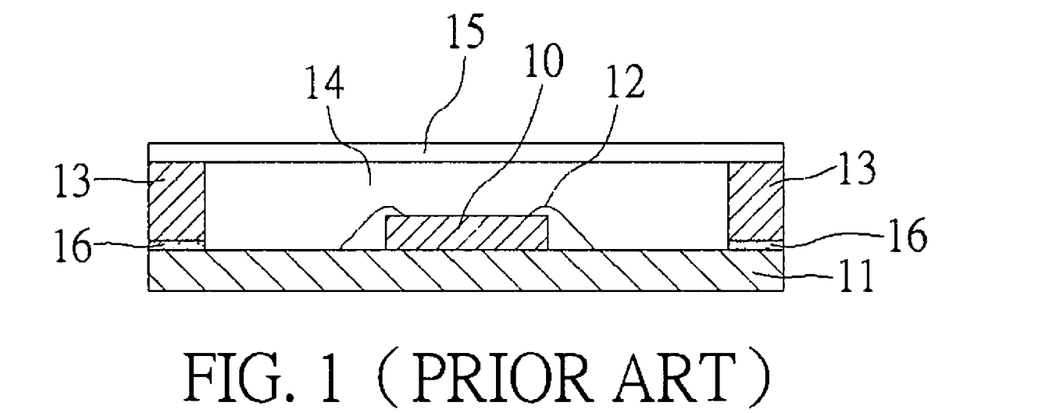
FIG. 1 (PRIOR ART) is a schematic cross-sectional diagram of a sensor-type semiconductor package disclosed by U.S. Pat. No. 6,060,340.

Referring to FIG. 1, a sensor-type semiconductor package disclosed by U.S. Pat. No. 6,060,340 is shown. A dam lattice 13 is prepared and attached to a substrate 11 by an adhesive 16. The dam lattice 13 has a wall-shaped structure that encloses a space 14 for receiving a sensor chip 10 and the bonding wires 12 therein, where the sensor chip 10 is electrically connected to the substrate 11 by the bonding wires 12. A glass 15 is attached to the dam lattice 13 for covering the space 14, thereby isolating the sensor chip 10 and the bonding wires 12 from external atmosphere and meanwhile allowing the light to pass through and reach the sensor chip 10 for activating the sensor chip 10. However, the adhesive 16 has a high moisture absorption property. When the adhesive 16 that has absorbed moisture experiences a high temperature environment, a popcorn phenomenon as well as delamination of the dam lattice from the substrate can occur, thereby the package reliability is reduced.

Figure 2A:
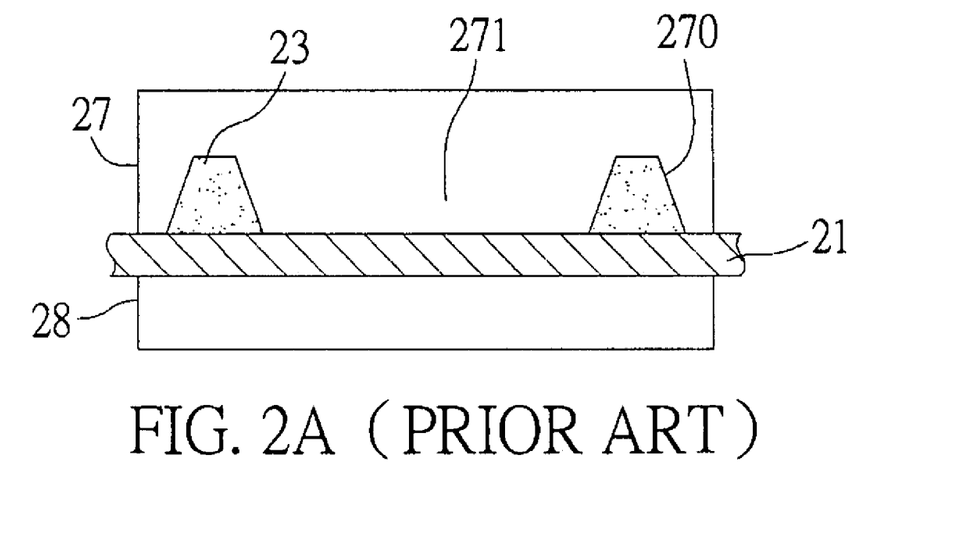
FIGS. 2A and 2B (PRIOR ART) are schematic cross-sectional diagrams of a sensor-type semiconductor package disclosed by U.S. Pat. No. 6,262,479 or U.S. Pat. No. 6,590,269.
Figure 2B:
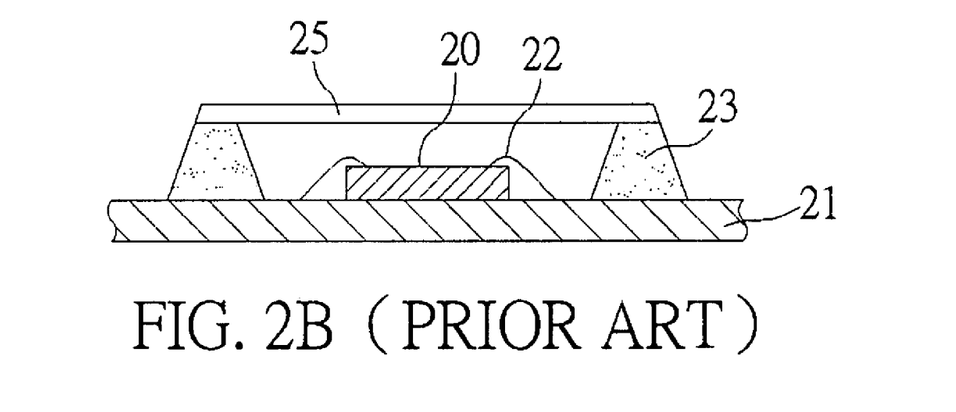

Referring to FIGS. 2A and 2B, another sensor-type semiconductor package as disclosed by U.S. Pat. No. 6,262,479 or U.S. Pat. No. 6,590,269 is shown, wherein sensor-type semiconductor packages do not need to use the mentioned adhesive for attaching the dam lattice. As shown in FIG. 2A, a molding process is performed for forming a dam lattice 23 on a substrate 21. A mold having an upper mold 27 and a lower mold 28 is employed. The upper mold 27 has mold cavities 270, and a protruding portion 271 is formed between the mold cavities 270. The substrate 21 is disposed between the upper mold 27 and the lower mold 28 with the protruding portion 271 contacting the substrate 21 so as to cover the predefined areas for mounting chip and bonding wires of the substrate 21. Subsequently, a resin compound, such as an epoxy resin, is injected into the mold cavities 270 so as to form a dam lattice 23 on the substrate 21. After the upper mold 27 and the lower mold 28 are removed, the predefined areas for mounting chip and bonding wires of the substrate 21 are exposed. As shown in FIG. 2B, a sensor chip 20 and the bonding wires 22 are disposed on the exposed area of the substrate 21 surrounded by the dam lattice 23. Finally, a glass 25 is attached to the dam lattice 23. Thereby, a sensor-type semiconductor package is obtained.

However, the above-described semiconductor package has several drawbacks. For example, the clamping force between the protruding portion and the substrate is difficult to control. If the protruding portion cannot be stably contacted with the substrate, the resin compound can easily overflow to the area between the protruding portion and the substrate, thereby causing contamination of the areas for mounting chip and bonding wires. On the other hand, if the protruding portion is tightly pressed against the substrate, the substrate can be damaged. Further, the fabrication cost for the mold having the protruding portion is high, and the mold needs to be changed according to different size of the predefined area of the substrate, thereby greatly increasing the fabrication cost and fabrication complexity.

Accordingly, U.S. Pat. No. 5,950,074 discloses a sensor-type semiconductor package that coats an adhesive having fluidity on the substrate for forming the dam lattice. Then, a glass can be attached to the dam lattice and cover the sensor chip and bonding wires.

However, a common problem exists in the above-described techniques. That is, as spaces need to be reserved for the dam lattice in the above-described semiconductor packages, it limits the packages size being further miniaturized.

Figure 3:
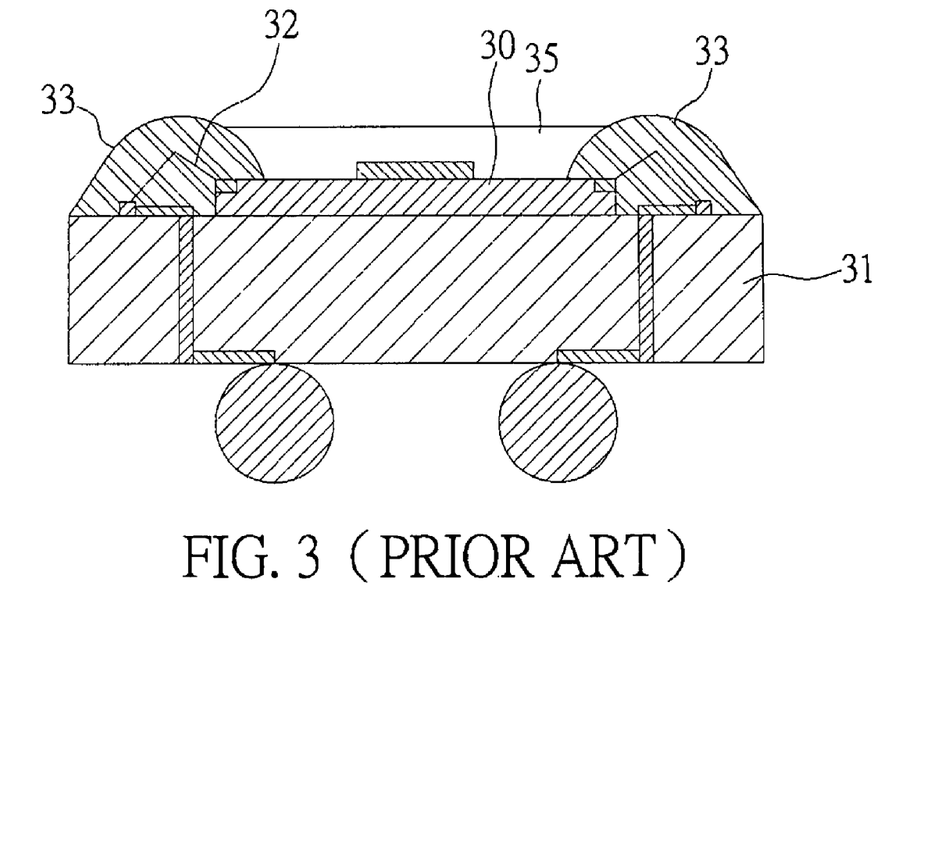
FIG. 3 (PRIOR ART) is a schematic cross-sectional diagram of a sensor-type semiconductor package disclosed by U.S. Pat. No. 5,962,810.

Referring to FIG. 3, U.S. Pat. No. 5,962,810 discloses a sensor-type semiconductor package with reduced size. As shown in FIG. 3, a sensor chip 30 is attached to a substrate 31 and electrically connected to the substrate 31 via the bonding wires 32. A fluid adhesive 33 is coated on the bonding wires 32 for serving as a dam lattice, which completely covering the bonding wires 32. Thereafter, a transparent adhesive 35 is coated on the sensor chip 30 for obtaining a sensor-type semiconductor package with reduced size. However, such a method has high fabrication cost and poor product reliability, thus limiting its application in the industry.

Figure 4:
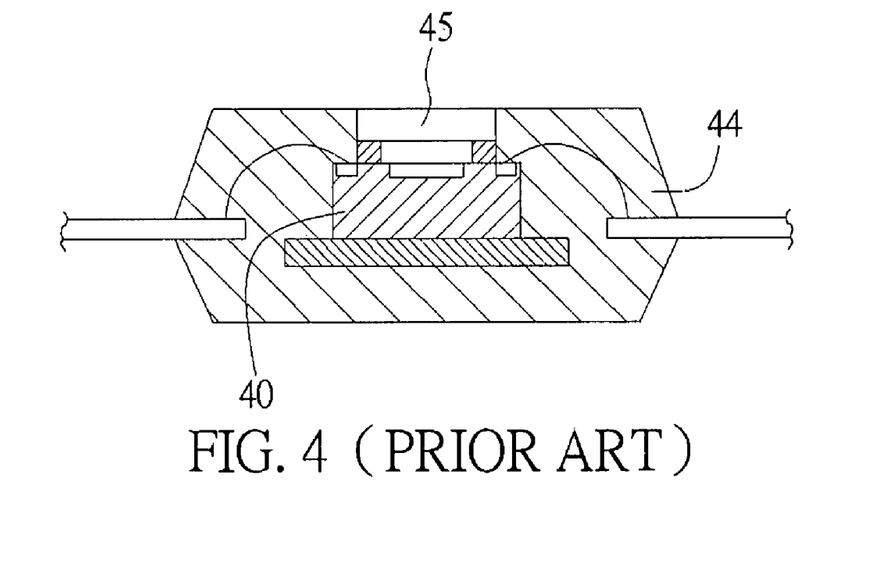
FIG. 4 (PRIOR ART) is a schematic cross-sectional diagram of a sensor-type semiconductor package disclosed by U.S. Pat. Publication No. 5,534,725.

Further referring to FIG. 4, according to U.S. Pat. No. 5,534,725, a glass 45 is attached to a sensor chip 40. During encapsulating the sensor chip 40, the glass 45 is abutted against the top of the upper mold of a packaging mold (not shown) so that after the mold is removed, the formed encapsulant 44 can encapsulate the sensor chip 40 with the glass 45 exposed from the encapsulant 44. However, because the glass 45 is directly abutted against the top of the upper mold, the upper and low mold clamping pressure is directly stressed on the glass 45, which can cause cracking of the glass 45 and further damage the sensor chip 40 below the glass 45. In addition, if a gap is existed between the upper mold and the glass, overflow of encapsulant can occur and thus surface of the glass 45 is contaminated.

Therefore, there is a need to develop a sensor-type semiconductor package and fabrication method thereof that can overcome the above drawbacks.

SUMMARY OF THE INVENTION

According to the above drawbacks, an objective of the present invention is to provide a lighter, thinner, shorter and smaller sensor-type semiconductor package without a dam lattice and a fabrication method thereof.

Another objective of the present invention is to provide a sensor-type semiconductor package, which is encapsulated by an encapsulant and has a high reliability, and a fabrication method thereof.

Still another objective of the present invention is to provide a low cost sensor-type semiconductor package and a fabrication method thereof.

A further objective of the present invention is to provide a sensor-type semiconductor package free from damaging the glass and sensor chip and a fabrication method thereof.

In order to attain the above and other objectives, the present invention discloses a fabrication method of a sensor-type semiconductor package, which comprises the steps of: providing a wafer having a plurality of sensor chips; attaching light-permeable bodies to the sensor chips, wherein, each light-permeable body has a first surface and a second surface opposing to the first surface, a covering layer is mounted on the first surface and a ring-shaped adhesive layer is mounted on the second surface, the light-permeable bodies are attached to the sensor chips through the ring-shaped adhesive layers on the second surfaces thereof, and a planar size of each of the light-permeable bodies is smaller than that of each of the sensor chips; singulating the wafer so as to obtain a plurality of separated sensor chips with the light-permeable bodies attached thereon; providing a substrate module having a plurality of substrates, and attaching the separated sensor chips to the substrates and electrically connecting the sensor chips to the substrates; performing a molding process so as to form an encapsulant on the substrate module, where the encapsulant encapsulates the sensor chips and the light-permeable bodies; cutting the encapsulant along edges of the light-permeable bodies to a depth at least corresponding to the bottom edges of the covering layers; removing the covering layers with a portion of the encapsulant mounted thereon so as to expose the light-permeable bodies from the encapsulant; and cutting between the substrates so as to obtain a plurality of sensor-type semiconductor packages.

Therein, each sensor chip has an active surface and a non-active surface opposing to the active surface, the sensor chip is attached to substrate through its non-active surface and the active surface of the sensor chip is connected to the substrate via a plurality of bonding wires. In addition, a bonding between the covering layer and the encapsulant is greater than that between the covering layer and the light-permeable body such that the covering layer and the portion of the encapsulant mounted thereon can be removed at the same time.

The present invention also discloses a sensor-type semiconductor package, which comprises: a substrate; a sensor chip attached to and electrically connected with the substrate; a light-permeable body attached to the sensor chip, where a planar size of the light-permeable body is smaller than that of the sensor chip; and an encapsulant formed on the substrate surrounding the sensor chip and the light-permeable body, wherein a top surface of the light-permeable body is exposed from the encapsulant, and side surfaces of the encapsulant and the substrate are flush with each other.

According to another preferred embodiment of the present invention, the sensor-type semiconductor package can be fabricated by the following steps: providing a substrate module having a plurality of substrates; attaching and electrically connecting a plurality of sensor chips to the substrates; attaching light-permeable bodies to the sensor chips, wherein, each light-permeable body has a first surface and a second surface opposing to the first surface, a covering layer is formed on the first surface and an adhesive layer is formed on the second surface, the light-permeable bodies are attached to the sensor chips through the adhesive layers on the second surfaces thereof, and a planar size of each of the light-permeable bodies is smaller than that of each of the sensor chips; performing a molding process so as to form an encapsulant on the substrate module for encapsulating the sensor chips and the light-permeable bodies; cutting the encapsulant along edges of the light-permeable bodies, wherein the cutting depth is set at least corresponding to the bottom edges of the covering layers; removing the covering layers and the portion of the encapsulant mounted thereon as to expose the light-permeable bodies from the encapsulant; and cutting between substrates so as to obtain a plurality of sensor-type semiconductor packages.

Therefore, the present invention mainly comprises attaching a plurality of light-permeable bodies each having a covering layer and an adhesive layer to a wafer having a plurality of sensor chips, wherein a planar size of each of the light-permeable bodies is smaller than that of each of the sensor chips; singulating the wafer so as obtain a plurality of separated sensor chips with the light-permeable bodies attached thereon; attaching and electrically connecting the separated sensor chips to the substrates of a substrate module. Alternatively, the mentioned steps could be performed by first attaching and electrically connecting the sensor chips to the substrates of the substrate module and then attaching the light-permeable bodies to the sensor chips. Thereafter, a molding process is performed for forming an encapsulant encapsulating the sensor chips and the light-permeable bodies, and the encapsulant is cut around the light-permeable bodies with a cutting depth at least corresponding to the bottom edges of the covering layers on the light-permeable bodies. Subsequently, the covering layers and the portion of the encapsulant mounted on the covering layer are removed so as to expose the light-permeable bodies, and the substrate module is cut between the substrates so as to obtain a plurality of sensor-type semiconductor packages. For such a sensor-type semiconductor package, external light can pass through the light-permeable body and be captured by the sensor chip.

As the dam lattice is not employed in the present invention, the sensor-type semiconductor package obtained according to the present invention becomes much thinner and smaller, the process reliability is increased and the fabrication cost is decreased. Meanwhile, as a covering layer is preformed on the light-permeable body and the encapsulant is formed on the covering layer during the molding process, the mold clamping pressure can be eliminated from being directly stressed on the light-permeable body as in the prior art, thereby preventing cracking of the light-permeable body and the sensor chip below the light-permeable body. In addition, the covering layer can protect the light-permeable body from being contaminated by the overflow during the molding process. Furthermore, the conventional molding process employed in the present invention can reduce fabrication cost and facilitate batch-type fabrication of semiconductor packages, thus reducing the fabrication cost and process complexity.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

FIGS. 5A to 5F are schematic cross-sectional diagrams showing a fabrication method of a sensor-type semiconductor package according to a first embodiment of the present invention. In the present embodiment, the sensor-type semiconductor package is fabricated in batch-type.

Figure 5A:
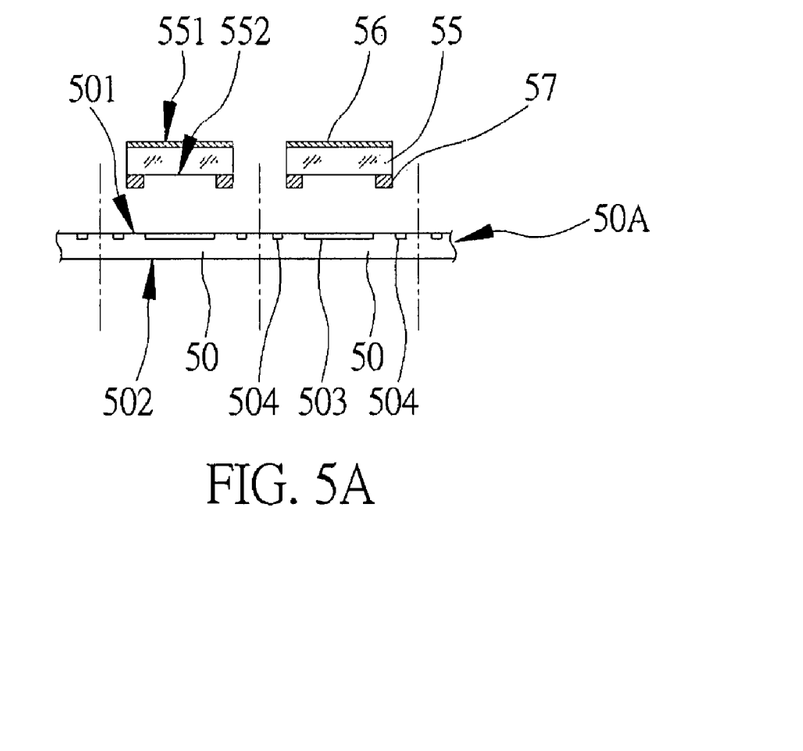
FIGS. 5A to 5F are schematic cross-sectional diagrams showing a fabrication method of a sensor-type semiconductor package according to a first embodiment of the present invention.
Figure 5B:
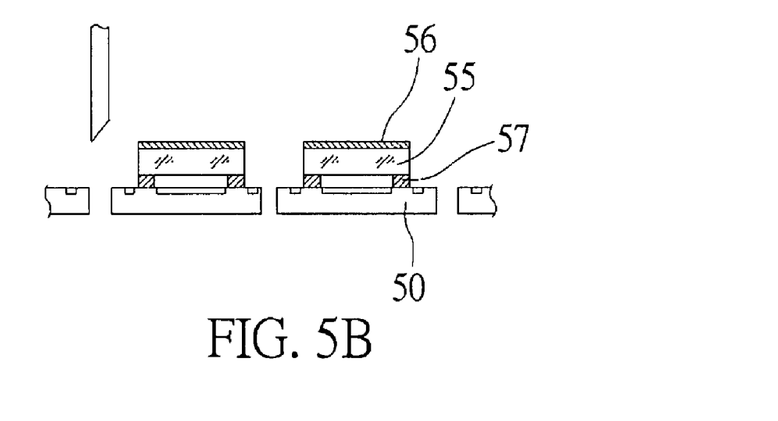

As shown in FIGS. 5A and 5B, a wafer 50A having a plurality of sensor chips 50 is provided, and a plurality of light-permeable bodies 55 are respectively attached to the sensor chips 50. Each light-permeable body has a first surface 551 and a second surface 552 opposing to the first surface 551. A covering layer 56 is formed on the first surface 551 and a ring-shaped adhesive layer 57 is formed on the second surface 552. The light-permeable bodies 55 are attached to the sensor chips 50 through the ring-shaped adhesive layers 57. In addition, a planar size of each of the light-permeable bodies 55 is smaller than that of each of the sensor chips 50. The wafer 50A is then singulated so as to obtain a plurality of separated sensor chips 50 with the light-permeable bodies 55 attached thereon.

Each sensor chip 50 has an active surface 501 and a non-active surface 502 opposing to the active surface 501, wherein, the active surface 501 has a sensor area 503 and a plurality of bonding pads 504 disposed thereon. The non-active surfaces 502 of the sensor chip 50 can be thinned first and then known good die is selected therefrom.

The light-permeable bodies 55 may be made of such as glass. The covering layer 56 may be made of such as tape, epoxy resin or wax so as to make the bonding between the covering layer 56 and the light-permeable body 55 smaller than that between the covering layer 56 and the encapsulant 56 which covers the covering layer 56 in subsequent processes. The ring-shaped adhesive layer 57 encloses the sensor area 503.

Figure 5C:
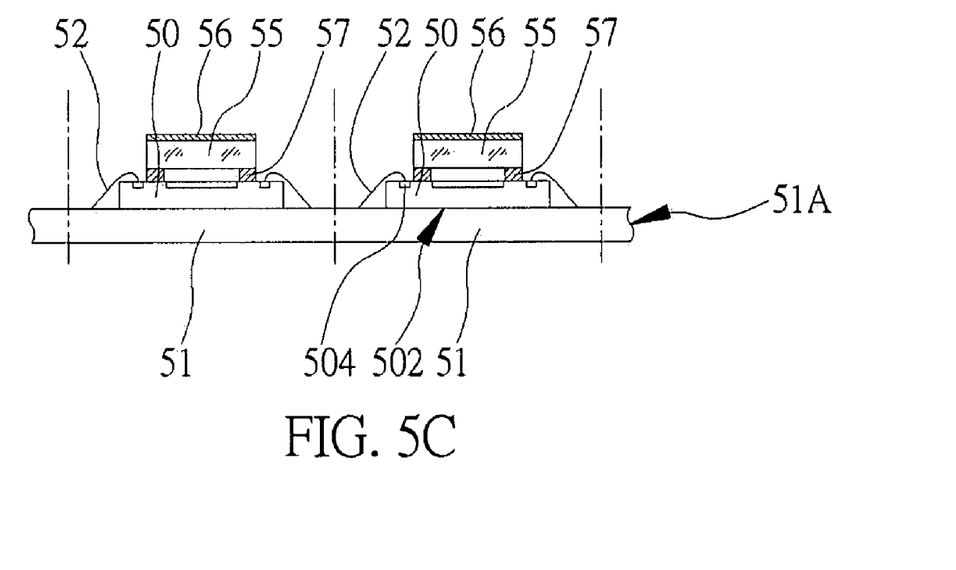

As shown in FIG. 5C, a substrate module 51A having a plurality of substrates 51 is provided, and the sensor chips 50 are respectively attached to and electrically connected with the substrates 51.

Each sensor chip 50 is attached to the corresponding substrate 51 through a non-active surface 502 thereof and a plurality of bonding wires 52 are employed to connect the bonding pads 504 of the sensor chip 50 and the substrate 51 so as to electrically couple the sensor chip 50 and the substrate 51.

Figure 5D:
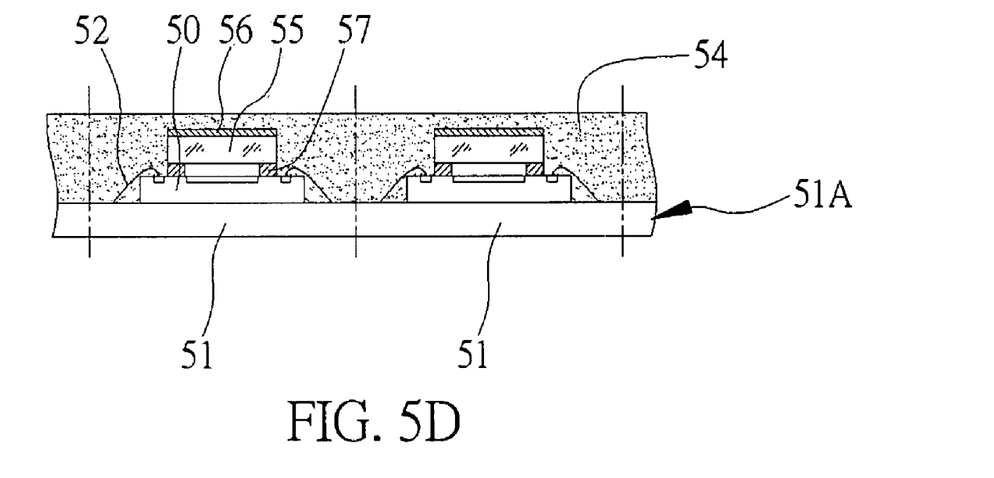

As shown in FIG. 5D, a molding process is performed so as to form an encapsulant 54 on the substrate module 51A which encapsulates the sensor chips 50, the bonding wires 52, the light-permeable bodies 55 and the covering layers 56 on the light-permeable bodies 55.

Figure 5E:
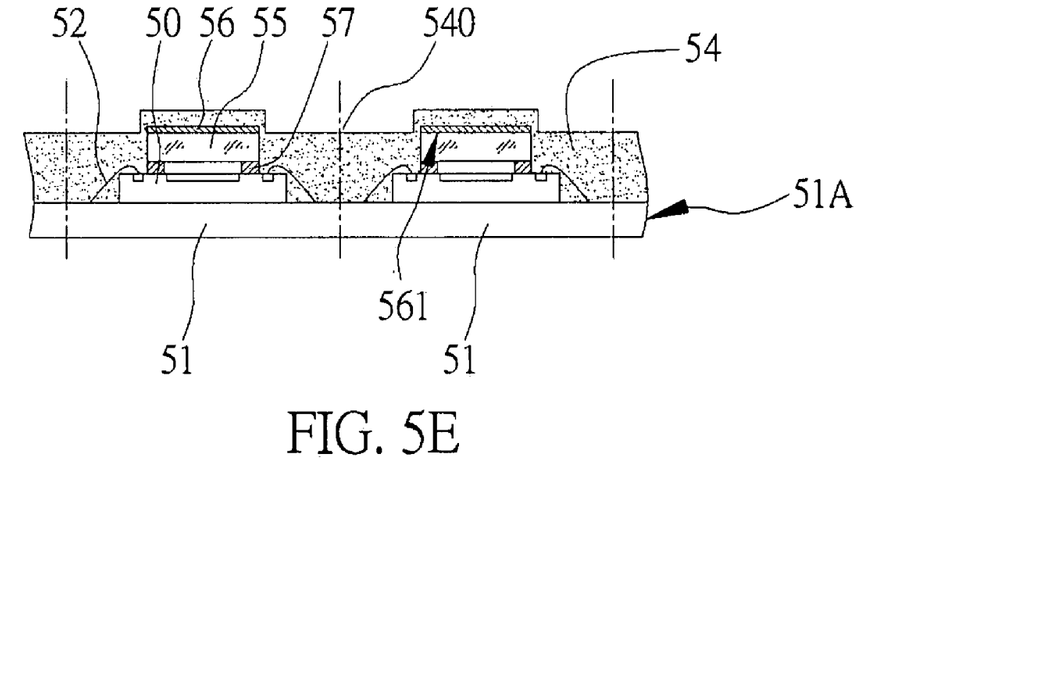

As shown in FIG. 5E, a portion of the encapsulant 54 around the covering layer 56 is laser cut or grinded so as to form a recess 540. The cutting depth of the recess 540 at least reaches the bottom edge 561 of the covering layer 56 and preferably exceeds the covering layer 56 about 0.05 to 0.1 mm. In addition, a distance from the recess 540 to the covering layer 56 can be 0 to 0.1 mm, preferably 0.05 mm. Further, the recess 540 can be extended to a depth that is 0.1 mm deeper than the bottom edge 561 of the covering layer 56, preferably, 0.05 mm deeper than the bottom edge 561 of the covering layer 56. During the process, the light-permeable body 55 should be protected from being damaged.

Figure 5F:
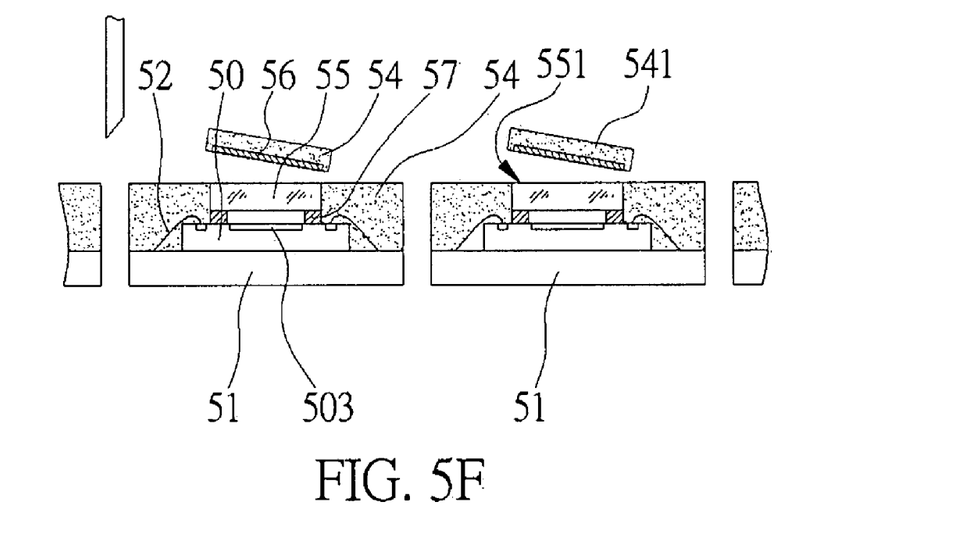

As shown in FIG. 5F, the covering layer 56 and a portion 541 of the encapsulant 54 located on the covering layer 56 are removed so as to expose the light-permeable body 55. Meanwhile, a cutting process is performed to the substrates 51 and the encapsulant 54 so as to obtain a plurality of sensor-type semiconductor packages without the dam lattice. As bonding between the covering layer 56 and the encapsulant 54 is larger than that between the covering layer 56 and the light-permeable body 55, the covering layer 56 and the portion 541 of the encapsulant 54 can be removed at the same time so as to expose the light-permeable body 55. Then, external lights can pass through the light-permeable body 55 and reach the sensor area 503 of the sensor chip 50 for activating the sensor chip 50.

Through the above fabrication method, the present invention also discloses a sensor-type semiconductor package, which comprises: a substrate 51; a sensor chip 50 attached to and electrically connected with the substrate 51; a light-permeable body 55 attached to the sensor chip 50, wherein, a planar size of the light-permeable body 55 is smaller than that of the sensor chip 50; and an encapsulant 56 formed on the substrate 51 through a molding process surrounds the sensor chip 50 and the light-permeable body 55, with a top surface 551 of the light-permeable body 55 exposed from the encapsulant 54 and side surfaces of the encapsulant 54 and the substrate 51 are flush with each other.

Second Embodiment

FIGS. 6A to 6E are schematic cross-sectional diagrams showing a fabrication method of a sensor-type semiconductor package according to a second embodiment of the present invention. The main difference of the present embodiment from the first embodiment is that the sensor chips are attached to and electrically connected with the substrates before the light-permeable bodies with the covering layers and the adhesive layers from thereon are attached to the sensor chips.

Figure 6A:
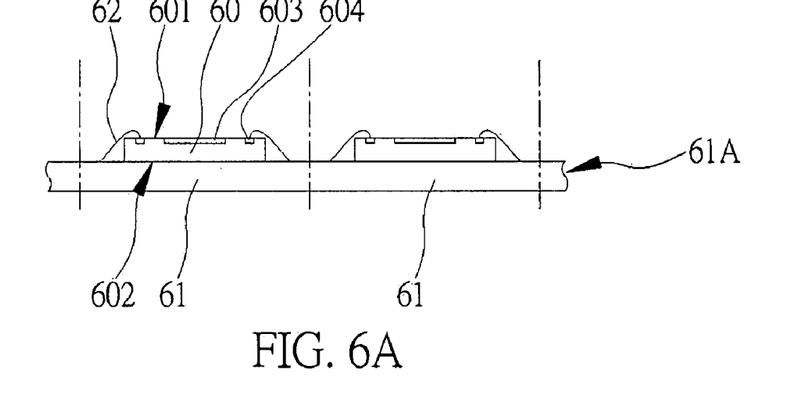
FIGS. 6A to 6E are schematic cross-sectional diagrams showing a fabrication method of a sensor-type semiconductor package according to a second embodiment of the present invention.

As shown in FIG. 6A, a substrate module 61A having a plurality of substrates 61 is provided, and sensor chips 60 are attached to the substrates 61. Each sensor chip 60 has an active surface 601 and a non-active surface 602 opposing to the active surface 601, and a sensor area 603 and bonding pads 604 are disposed on the active surface 601. The sensor chips 60 are attached to the substrates 61 through the non-active surfaces 602 thereof, and the bonding pads 604 of the sensor chips 60 are electrically connected to the substrates 61 via a plurality of bonding wires 62.

Figure 6B:
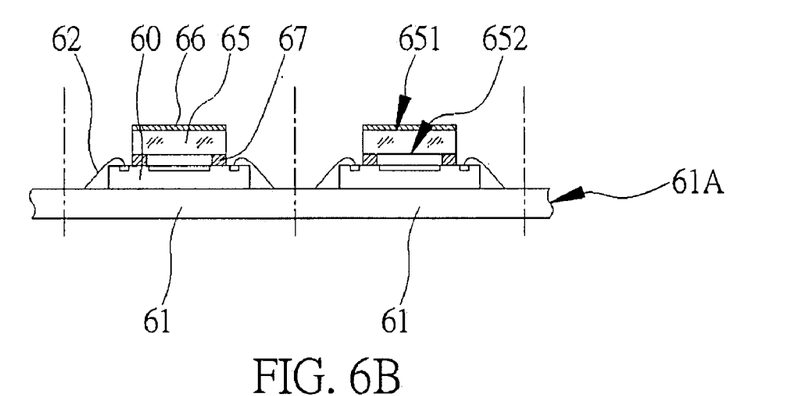

As shown in FIG. 6B, a plurality of light-permeable bodies 65 are provided. Each light-permeable body 65 has a first surface 651 and a second surface 652 opposing to the first surface 651, where a covering layer 66 is formed on the first surface 651 and a ring-shaped adhesive layer 67 is formed on the second surface 652. The light-permeable bodies 65 are respectively attached to the sensor chips 60 through the adhesive layers 67.

Figure 6C:
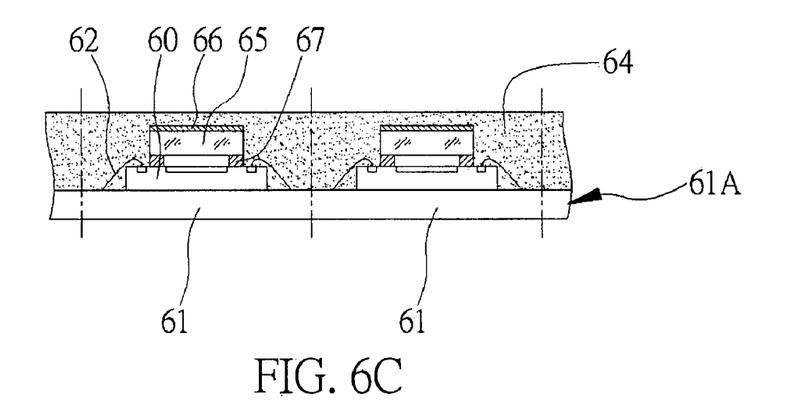

As shown in FIG. 6C, a molding process is performed so as to form an encapsulant 64 on the substrate module 61A, wherein the encapsulant 64 encapsulates the sensor chips 60, the bonding wires 62, the light-permeable bodies 65 and the covering layers 66 on the light-permeable bodies 65.

Figure 6D:
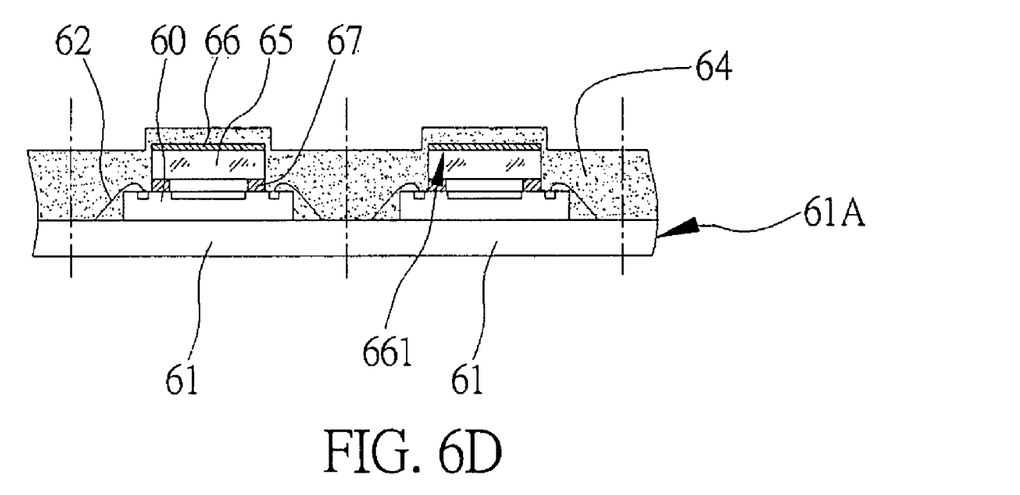

As shown in FIG. 6D, the encapsulant 64 around the light-permeable bodies 65 is cut, wherein the cutting depth reaches at least corresponding to the bottom edge 661 of the covering layers 66 on the light-permeable bodies 65.

Figure 6E:
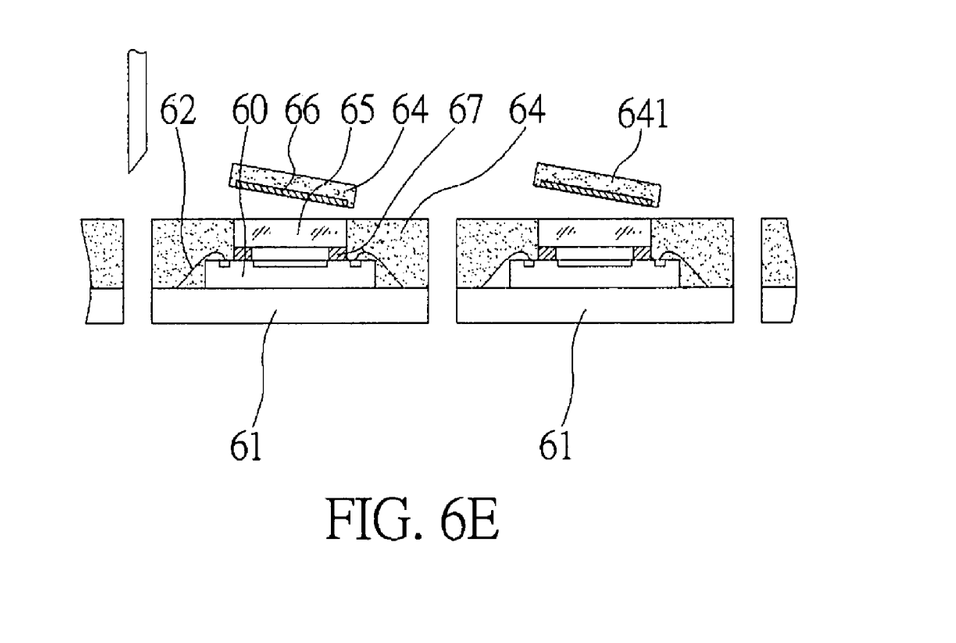

As shown in FIG. 6E, the covering layers 66 and the portion 641 of the encapsulant 64 located on the covering layers 66 are removed so as to expose the light-permeable bodies 65. Meanwhile, the substrate module 61A and the encapsulant 64 are cut between the substrates 61 so as to obtain a plurality of sensor-type semiconductor packages without any dam lattice formed thereon.

Third Embodiment

Figure 7:
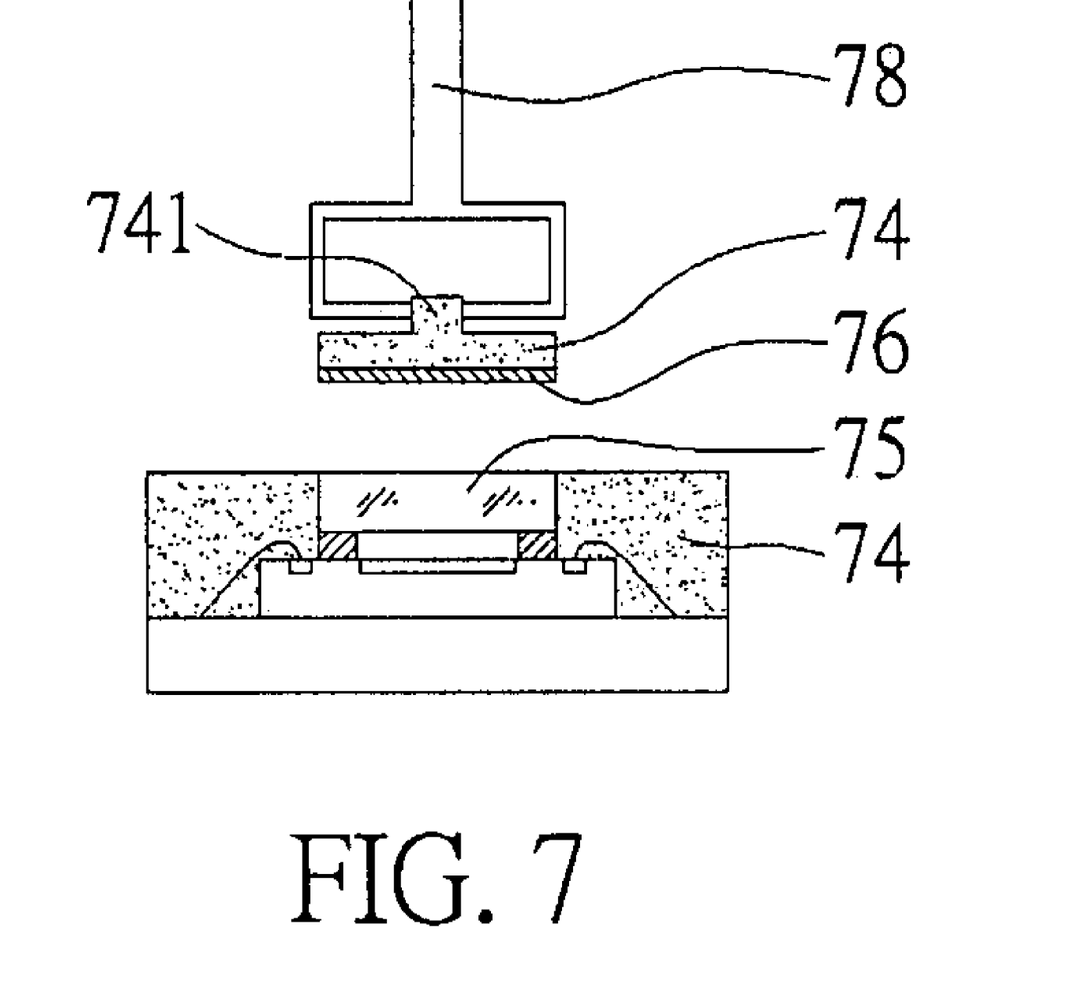
FIG. 7 is a schematic cross-sectional diagram showing a fabrication method of a sensor-type semiconductor package according to a third embodiment of the present invention.

FIG. 7 is a schematic cross-sectional diagram showing a fabrication method of a sensor-type semiconductor package according to a third embodiment of the present invention. In the present embodiment, for facilitating the removal of the covering layer 76 and the encapsulant 74 located on the covering layer 76, a protruding portion 741 is formed on the top surface of the encapsulant 74. Thus, a clamping tool 78 can be employed to clamp the protruding portion 741 for removing the covering layer 76 and the encapsulant 74 located on the covering layer 76.

Therefore, the present invention mainly comprises attaching a plurality of light-permeable bodies each having a covering layer and an adhesive layer to a wafer having a plurality of sensor chips, wherein a planar size of each of the light-permeable bodies is smaller than that of each of the sensor chips; singulating the wafer so as obtain a plurality of separated sensor chips with the light-permeable bodies attached thereon; attaching and electrically connecting the sensor chips to the substrates of a substrate module. Alternatively, the method fabrication method of the present invention could be performed by attaching and electrically connecting the sensor chips to the substrates of the substrate module and then attaching the light-permeable bodies to the sensor chips. Thereafter, a molding process is performed for forming an encapsulant encapsulating the sensor chips and the light-permeable bodies, and the encapsulant is cut around the light-permeable bodies with the cutting depth thereof at least reaches the bottom edges the covering layers on the light-permeable bodies. Subsequently, the covering layers and a portion the encapsulant mounted thereon are removed so as to expose the light-permeable bodies, and the substrate module is cut between the substrates so as to obtain a plurality of sensor-type semiconductor packages. For such a sensor-type semiconductor package, external light can pass through the light-permeable body and be captured by the sensor chip.

As the dam lattice is not employed in the present invention, the sensor-type semiconductor package obtained according to the present invention becomes much thinner and smaller, the process reliability is increased and the fabrication cost is decreased. Meanwhile, as a covering layer is preformed on the light-permeable body and the encapsulant is formed on the covering layer during the molding process, the clamming pressure of the mold can be prevented from being directly stressed on the light-permeable body as in the prior art, thereby preventing cracking of the light-permeable body and the sensor chip below the light-permeable body. In addition, the covering layer can protect the light-permeable body from being contaminated by the overflow during the molding process in the prior art. Furthermore, the conventional molding process employed in the present invention can reduce the fabrication cost and facilitate batch-type fabrication of semiconductor packages, thus reducing the fabrication cost and process complexity.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fabrication method of a sensor-type semiconductor package, comprising steps of:
    providing a wafer having a plurality of sensor chips;
    attaching light-permeable bodies to the sensor chips, wherein, each light-permeable body has a first surface, a second surface opposing to the first surface and a planar size smaller than that of a respective one of the sensor chips, a covering layer is mounted on the first surface, a ring-shaped adhesive layer is mounted on the second surface, and the light-permeable bodies are attached to the sensor chips through the ring-shaped adhesive layers on the second surfaces thereof;
    singulating the wafer so as to obtain a plurality of separated sensor chips with the light-permeable bodies attached thereon;
    providing a substrate module having a plurality of substrates;
    attaching the separated sensor chips to the substrates;
    electrically connecting the sensor chips to the substrates;
    forming an encapsulant on the substrate module for encapsulating the sensor chips and the light-permeable bodies by a molding process;
    cutting the encapsulant along edges of the light-permeable bodies to edges of the covering layers;
    removing the covering layers with a portion of the encapsulant mounted thereon so as to expose the light-permeable bodies from the encapsulant; and
    cutting between the substrates so as to obtain a plurality of sensor-type semiconductor packages.

2. The fabrication method of claim 1, wherein each of the sensor chips has a sensor area and a plurality of bonding pads, an active surface with the sensor area and the plurality of bonding pads mounted thereon, and a non-active surface opposing to the active surface.

3. The fabrication method of claim 2, wherein the non-active surface of the sensor chip is thinned and the sensor chip is selected before the step of attaching light-permeable bodies to the sensor chips.

4. The fabrication method of claim 2, wherein the respective sensor chips are attached to the substrates through the non-active surfaces thereof, and the plurality of bonding pads of the respective sensor chips are connected to the substrates by a plurality of bonding wires.

5. The fabrication method of claim 1, wherein the light-permeable bodies are made of glass, the covering layers are made of one selected from a group consisting of tape, epoxy resin and wax for forming each bonding between the covering layers and the light-permeable bodies smaller than that between the covering layers and the encapsulant.

6. The fabrication method of claim 1, wherein during cutting the encapsulant along edges of the light-permeable bodies, a plurality of recesses are formed with respective depth thereof being at least corresponding to the edge of the covering layers.

7. The fabrication method of claim 6, wherein a distance between each of the recesses and an adjacent one of the covering layers is not larger than 0.1 mm.

8. The fabrication method of claim 6, wherein the recesses are 0.05 mm to 0.1 mm deeper than the bottom edges of the covering layers, and a distance between each of the recesses and an adjacent one of the covering layers is 0.05 mm.

9. The fabrication method of claim 1, wherein each bonding between the covering layers and the encapsulant is greater than that between the covering layers and the light-permeable bodies.

10. The fabrication method of claim 1, wherein a protruding portion is formed on a top surface of the encapsulant after the encapsulant around the light-permeable body is cut away, such that a clamping tool is employed to clamp the protruding portion for removing the covering layer with the portion of the encapsulant mounted thereon.

11. A fabrication method of a sensor-type semiconductor package, comprising the steps of:
providing a substrate module having a plurality of substrates;
attaching and electrically connecting a plurality of sensor chips to the substrates;
attaching light-permeable bodies to the sensor chips, wherein, each light-permeable body has a first surface, a second surface opposing to the first surface and a planar size smaller than that of a respective one of the sensor chips, a covering layer is mounted on the first surface, a ring-shaped adhesive layer is mounted on the second surface, and the light-permeable bodies are attached to the sensor chips through the ring-shaped adhesive layers on the second surfaces thereof;
forming an encapsulant on the substrate module for encapsulating the sensor chips and the light-permeable bodies by a molding process;
cutting the encapsulant along edges of the light-permeable bodies to edge of the covering layers;
removing the covering layers with a portion of the encapsulant mounted thereon so as to expose the light-permeable bodies from the encapsulant; and
cutting between substrates so as to obtain a plurality of sensor-type semiconductor packages.

12. The fabrication method of claim 11, each of the sensor chips has a sensor area and a plurality of bonding pads, an active surface with the sensor area and the plurality of bonding pads mounted thereon, and a non-active surface opposing to the active surface.

13. The fabrication method of claim 12, wherein the non-active surface of the sensor chip is thinned and the sensor chip is selected before the step of attaching light-permeable bodies to the sensor chips.

14. The fabrication method of claim 12, wherein the respective sensor chips are attached to the substrates through the non-active surfaces thereof, and the plurality of bonding pads of the respective sensor chips are connected to the substrates by a plurality of bonding wires.

15. The fabrication method of claim 11, wherein the light-permeable bodies are made of glass, the covering layers are made of one selected from a group consisting of tape, epoxy resin and wax for forming each bonding between the covering layers and the light-permeable bodies smaller than that between the covering layers and the encapsulant.

16. The fabrication method of claim 11, during cutting the encapsulant along edge of the light-permeable bodies, a plurality of recesses are formed with respective depth thereof at most 0.1 mm deeper than the edges of the covering layers.

17. The fabrication method of claim 16, wherein a distance between each of the recesses and an adjacent one of the covering layers is not larger than 0.1 mm.

18. The fabrication method of claim 16, wherein the recesses are 0.05 mm to 0.1 mm deeper than the bottom edges of the covering layers, and a distance between each of the recesses and an adjacent one of the covering layers is 0.05 mm.

19. The fabrication method of claim 11, wherein each bonding between the covering layers and the encapsulant is greater than that between the covering layers and the light-permeable bodies.

20. The fabrication method of claim 11, wherein a protruding portion is formed on a top surface of the encapsulant after the encapsulant around the light-permeable body is cut away, such that a clamping tool is employed to clamp the protruding portion for removing the covering layer with the portion of the encapsulant mounted thereon.

* * * * *